United States Patent [19]

Hunold et al.

[11] Patent Number: 4,528,120
[45] Date of Patent: Jul. 9, 1985

[54] REFRACTORY, ELECTRICALLY CONDUCTIVE, MIXED MATERIALS CONTAINING BORON NITRIDE AND PROCESS FOR THEIR MANUFACTURE

[75] Inventors: Klaus Hunold, Kempten; Alfred Lipp, Bad Worishofen; Klaus Reinmuth, Durach, all of Fed. Rep. of Germany

[73] Assignee: Elektroschmelzwerk Kempten GmbH, Munich, Fed. Rep. of Germany

[21] Appl. No.: 601,986

[22] Filed: Apr. 19, 1984

[30] Foreign Application Priority Data

Jul. 14, 1983 [DE] Fed. Rep. of Germany ....... 3325490

[51] Int. Cl.$^3$ .............................................. H01B 1/04
[52] U.S. Cl. .................................... 252/516; 252/518; 252/520; 419/38; 419/42; 419/49; 419/57; 419/60; 428/610
[58] Field of Search ....................... 252/516, 518, 520; 501/96; 428/610, 620, 627; 419/38, 42, 48, 49, 56, 57, 60

[56] References Cited

U.S. PATENT DOCUMENTS

| | | | |
|---|---|---|---|
| 3,236,633 | 2/1966 | Grulke et al. | 252/516 |
| 3,890,250 | 6/1975 | Richerson | 252/516 |
| 4,199,480 | 4/1980 | Parent et al. | 252/516 |

*Primary Examiner*—Josephine L. Barr
*Attorney, Agent, or Firm*—Burgess, Ryan & Wayne

[57] ABSTRACT

The invention is refractory, electrically conductive, mixed materials based on hexagonal boron nitride and at least one electrically conductive component such as titanium boride and zirconium boride, and having a density of at least about 95% of the theoretical density and nondirection-dependent properties, which have been manufactured from powder mixtures that are practically free of oxygen and metal and comprise from about 10 to 60% by weight of boron nitride,
from about 0 to 60% by weight of aluminum nitride and/or silicon nitride, and
from about 30 to 70% by weight of an electrically conductive component, without the concomitant use of sintering aids by means of isostatic hot pressing in a vacuum-tight casing at temperatures of from about 1400° to 1700° C. and under a pressure of from about 100 to 300 MPa. The powder mixtures are pre-densified to form green bodies in block form and are then introduced into casings or coated with a material forming a vacuum-tight casing. The pre-densified green bodies in the vacuum-tight casing are then subjected to the isostatic hot-pressing process in a high-pressure autoclave, using an inert gas such as argon, as pressure-transmission medium. The article formed from the mixed materials are used to manufacture evaporation boats for the vacuum evaporation of metals.

10 Claims, No Drawings

4,528,120

REFRACTORY, ELECTRICALLY CONDUCTIVE, MIXED MATERIALS CONTAINING BORON NITRIDE AND PROCESS FOR THEIR MANUFACTURE

Refractory, electrically conductive, mixed materials that in addition to at least one electrically conductive component contain varying amounts of hexagonal boron nitride, have been known for a long time. Such materials are used, especially, for the manufacture of evaporation boats which are heated by the direct passage of current when they are used in the vacuum evaporation of metals. Mixed materials suitable for use as evaporation boats contain, for example, as electrically conductive components, borides of titanium, zirconium, aluminum and chromium, and/or carbides of silicon, titanium or chromium, borides of titanium and zirconium having proved especially suitable.

BACKGROUND OF THE INVENTION

The electrical resistance of the evaporation boats is generally determined by the amount of hexagonal boron nitride in the composition, as an electrically non-conductive component. The amount of boron nitride in the mixed material varies over a wide range and the mixed material can be adapted to meet many requirements. Furthermore, because of its properties, the addition of boron nitride makes the evaporation boats easier to shape, (cf. U.S. Pat. No. 3,181,968 and U.S. Pat. No. 3,673,118). Similarly, mixed materials that additionally contain aluminum nitride and/or silicon nitride, which are intended to improve the mechanical strength of the evaporation boats, are known (cf. U.S. Pat. Nos. 3,544,486 and 3,813,252 and GB Pat. No. 1,251,664).

To manufacture articles comprising the mixed materials, it is customary to subject homogeneous powder mixtures to hot pressing in graphite moulds. Temperatures of at least 1800° C. are required to produce solid articles of adequate density. As is known, the boron nitride powder in the mixture, cannot be densified to a great extent alone without the concomitant use of sintering aids. The boron nitride also inhibits sintering of the powder mixtures. As a result, under the above-mentioned hot-pressing conditions, in general, only densities of less than 95% of the theoretical density are obtained when boron nitride is present in the powder mixture.

The addition of sintering aids makes it possible to obtain articles having a higher density by hot pressing mixed materials containing boron nitride. Examples of sintering aids are aluminum (cf. DE-AS No. 2,200,665 and U.S. Pat. No. 4,008,183), carbon (cf. U.S. Pat. No. 3,649,314), boric oxide (cf. U.S. Pat. No. 3,915,900) and nickel (cf. U.S. Pat. No. 4,268,314). Due to the use of sintering aids which collect preferentially at the grain boundaries during the sintering process, and can form glass-like phases, weak spots, which corrode easily during the vacuum evaporation of metals, are pre-programmed into the evaporation boats manufactured from these mixed materials. Such boats therefore have unsatisfactory corrosion behaviour in use.

Since hot pressing on an industrial scale is a cost-intensive process, the known mixed materials are manufactured, for economic reasons, in the form of large blocks from which the individual evaporation boats are cut and machined to the desired final dimensions. Depending on the size of the individual boats, up to one hundred boats can be manufactured from a hot-pressed block. In addition to the difficulty in attaining a high degree of densification, the manufacture of evaporation boats is made more difficult by the fact that a density gradient exists in the block. That is, the density distribution within the block is non-uniform and the properties of the block are direction-dependent. The non-uniform properties results in a resistance gradient over the length of each individual boat manufactured from the block. When the boat is used that is, when it is heated by the direct passage of current, the non-uniform resistance leads to non-uniform evaporation of the metal and spot overheating which causes corrosion at those points.

The density gradient in the block is caused by the biaxial die pressure which causes the formation of a double pressure cone. The double pressure cone causes non-uniform heat transfer which leads to differing degrees of densification. The maximum pressure is limited by the strength of the graphite of the press die so that elimination of the density gradient cannot be achieved by increasing the pressure.

BRIEF SUMMARY OF THE INVENTION

The object of the present invention is to provide refractory, electrically conductive articles comprising of mixed materials especially in the form of large blocks which not only have a high density but also a uniform density distribution. The articles of the present invention are manufactured in a simple manner by densifying powder mixtures without the concomitant use of sintering aids.

The articles of the present invention comprising mixed materials have a density of at least about 95% of the theoretical density (abbreviated to % TD below) and have non-direction-dependent properties. The articles are manufactured using powder mixtures that are virtually free of oxygen and metal and comprise

- about 10–60% by weight of hexagonal boron nitride,
- about 0–60% by weight of at least one composition selected from aluminum nitride and silicon nitride, and
- about 30–70% by weight of at least one electrically conductive material selected from the group consisting of the borides of titanium, zirconium, aluminum and chromium and the carbides of silicon, titanium and chromium, by means of isostatic hot pressing in a vacuum-tight casing at a temperature of from about 1400° to 1700° C. and under a pressure of from about 100 to 300 MPa, using an inert gas as a pressure-transmission medium. The process is generally carried out in a high pressure autoclave.

DETAILED DESCRIPTION OF THE INVENTION

For the manufacture of the articles from the mixed materials according to the invention, a fine powder comprising hexagonal boron nitride is preferably used. The boron nitride powder preferably has a specific surface area in the range of from about 2 to 30 m$^2$/g, and most preferably in the range of from about 4 to 16 m$^2$/g, (measured by the BET method). The surface area serves as a measure of particle size. The boron nitride preferably has a purity of at least about 98.0% by weight. By 98% purity is meant that the total of boron and nitrogen found by analysis is at least 98.0% by weight. Oxygen in the powder, in the form of adherent boric oxide and boron oxynitrides, can be present in an amount up to about 1.7% by weight. In addition, a total of up to about 0.1% by weight of carbon and up to about 0.2% by weight of metal impurities can be tolerated.

Preferably, titanium boride or zirconium boride powder which has a low oxygen content and is virtually free of metal in non-bonded form is used as the electrically conductive material to form the mixed material powder mixture. Aluminum nitride and silicon nitride powders that can optionally be used in the mixture should have a low oxygen content and be substantially free of metal in a non-bonded form. Because of their hardness, the powders are preferably separately subjected to intensive grinding until particle sizes of less than about 50 $\mu$m are obtained and then freed from the impurities introduced during grinding. The ground powders are then mixed with the boron nitride powder to form a homogeneous mixture. The mixing process can be carried out dry or wet, for example, organic solvents such as acetone, methanol or isopropanol can be used.

Powder mixtures containing boron nitride generally have a low bulk density and shrink to a large degree when densified. The dry powder mixtures are preferably predensified to form green bodies having open pores that is, having pores open to the surface before being encased in a gas-impermeable casing.

Shaping and predensification can be carried out using known methods such as die pressing. Isostatic cold pressing has proven especially suitable since a uniform degree of pre-densification can be achieved. The use of a temporary binder is not generally required. However, small amounts of a temporary binder such as camphor, can be used. It is critical that the binder used should decompose leaving virtually no residue, at temperatures of less than about 1000° C. After being shaped, the green body preferably has a density of at least about 50% and most preferably, at least about 60% TD.

The gas-impermeable closable casings are preferably prefabricated casings of metal or metal alloys. The casings must be plastically deformable at the densification temperature used. At temperatures of up to approximately 1500° C., casings of sheet steel may be used. At higher temperatures, however, casings of refractory metals, for example molybenum, are necessary. In addition, it is preferred to have a layer of heat-resistant material between the casing and the green body, in order to prevent reaction between the casing and the green body during the isostatic hot-pressing process. As an example, polycrystalline aluminum oxide fibers can be used as the heat resistant material.

After the pre-densified green bodies, including the intermediate layer, have been introduced into the casings, the arrangement is subjected in vacuo to a heat treatment, by heating to from about 500° to 1300° C., to ensure that no gaseous decomposition products from the binders, or moisture, interferes with the densification process or damages the casing. When the contents of the casing have been fully degassed, the casing is made gas-impermeable in vacuo.

Instead of introducing the pre-densified green bodies into prefabricated casings, it is possible for the gas-impermeable casing to be produced on the green body by direct coating. For example, a metal layer can be formed on the green body vacuum evaporation, flame spraying or plasma spraying of a metal in vacuo or a layer of a glass-like or ceramic material can be formed on the green body. The metal layer or ceramic or glass-like material is then melted or sintered, in vacuo to form the gas-impermeable casing. It is preferred to subject the green body to heat treatment to degas it before providing it with the gas-impermeable casing.

The encased bodies are introduced into a high-pressure autoclave and heated to a densification temperature of at least about 1400° C. It is preferred to adjust the pressure and temperature separately that is, to increase the gas pressure only when the casing material begins to deform plastically. It is preferred to use gases such as helium or nitrogen and, preferably, argon for pressure transmission. The pressure applied is preferably in the range of from about 100 to 300 MPa, which is achieved by a slow increase when the final temperature is reached. The optimum conditions, in each case, in respect to pressure, temperature and dwell time at the densification temperature are dependent on the composition of the powder mixture. That is, with amounts of boron nitride above about 35% by weight in the powder mixture, densification temperatures in the range of from about 1400° C. to 1500° C. are generally sufficient, whereas when the powder mixture contains smaller amounts of boron nitride, temperatures of up to about 1700° C. are required to achieve the desired degree of densification. After the pressure and temperature have been reduced, the cooled bodies are removed from the high-pressure autoclave and the casings can be removed mechanically or chemically.

The articles made of the refractory electrically conductive material of the present invention have a density of at least about 95% TD. The density depends on the pressure, the temperature, and the dwell time used in the process. Because the pressure is applied on all sides, the articles of the invention have a uniform density distribution within the article and a uniform isotropic microstructure. Their properties are not direction-dependent but are uniform in all directions.

Evaporation boats can be made from the articles in any desired direction, which permits the best possible use of the material. The boats have properties that are independent of direction, for example, they have a uniform resistance over the length of the boat which is of critical importance for good corrosion resistance of the boats.

It is generally known that shaped articles having up to 100% of the theoretical density can be obtained by isostatic hot pressing. In the case of the mixed materials which are used for the manufacture of evaporation boats, however, 100% densification, that is, complete freedom from pores, is not essential. However, a uniform density distribution together with fine, uniformly distributed pores is important. The adjustment of the uniformly distributed fine pores by controlling the % TD, in the range of from greater than about 95% and less than 100% TD, can be achieved in the manufacture of the articles of mixed materials according to the invention in a simple manner by regulating the dwell time under the particular pressure used and the temperature as a function of the powder composition. In contrast, in the hot-pressing processes used in the prior art, the porosity was always left to chance since the achievement of a density of about 95% TD without the concomitant use of sintering aids presented difficulties.

The best results in respect to durability are achieved with evaporation boats which have been manufactured from the mixed materials according to the invention having uniformly distrubuted fine pores. As a result of the high density, infiltration of the molten metal during the evaporation process is prevented but, because of the porosity, thermal expansion which occurs while the boats are rigidly clamped, is absorbed. Virtually pore-free boats tend to bend or tear under such conditions.

The invention is explained in detail with reference to the following examples which are for illustration only and are not intended to limit the invention.

In the examples, powders having the following analysis were used as starting materials:

|  |  | $TiB_2$ | BN | AlN |
|---|---|---|---|---|
| Ti | % by weight | 66.1 | 0.01 | 0.1 |
| Al | " | — | — | 64.7 |
| B | " | 31.2 | 43.3 | <0.01 |
| N | " | 0.6 | 55.6 | 33.4 |
| O | " | 1.3 | 1.0 | 1.2 |
| C | " | 0.8 | 0.04 | 0.3 |
| $B_2O_3$ | " | 0.5 | 0.02 | — |
| Fe | " | 0.05 | <0.01 | 0.2 |
| Ca | " | — | 0.02 | — |
| specific surface area | $m^2/g$ | 1.6 | 10.1 | 0.9 |
| mean particle size | $\mu m$ | 4.3 | 1.25 | 10 |

EXAMPLE 1

20 kg of a powder mixture comprising 57% by weight of $TiB_2$ and 43% by weight of BN was homogenized dry for 5 hours in a ball mill having steel balls. The powder mixture was isostatically cold pressed in a polyvinyl chloride casing under a liquid pressure of 400 MPa, to form a cylindrical green body having a diameter of 200 mm and a height of 300 mm.

The green body was introduced into a prefabricated casing made of 2 mm thick sheet steel (St 37). A layer of polycrystalline aluminum oxide fibers was arranged between the casing and the green body. The lid, fitted with a vacuum tube, was welded to the steel casing in a gas tight manner. The green body and casing were then heated to 800° C. in a furnace with protective gas flushing. At the same time, the casing was evacuated via the vacuum tube using a vacuum pump. After a vacuum of less than $10^{-1}$ mbar was obtained in the casing, the vacuum tube was sealed gas tight. The encased body was introduced into the hot-isostatic pressing zone and densified at 1450° C. under an argon gas pressure of 200 MPa and for a dwell time of 180 minutes. After being cooled, the steel casing was removed mechanically from the densified body.

Evaporation boats 110 mm × 20 mm × 10 mm were cut in various directions from the block and were provided with a depression measuring 70 mm × 15 mm × 2 mm.

Irrespective of their position in the block, the evaporation boats had a density of 97.3 ± 0.2% TD. The specific resistance was 573 ± 10 $\mu ohm \times cm$.

EXAMPLE 2

As described in Example 1, 20 kg of a powder mixture comprising 53% by weight of $TiB_2$, 30% by weight of BN and 17% by weight of AlN were homogenized and subjected to cold isostatic pressing to form a cylindrical green body having a diameter of 150 mm and a height of 200 mm.

The green body was introduced into a prefabricated casing of 0.5 mm thick molybdenum sheet. Before the casing was sealed gas-tight in vacuo, it was heated to 1000° C. under reduced pressure. The encased body was introduced into a hot-isostatic pressing zone and densified at 1650° C. under an argon gas pressure of 200 MPa for a dwell time of 120 minutes. After being cooled, the molybdenum casing was removed mechanically from the densified body.

Evaporation boats having the same dimensions as in Example 1 were cut in different directions from the block. Irrespective of their position in the block, the evaporation boats had a density of 98.6 ± 0.2% TD of the mixture. The specific resistance was 515 ± g$\mu$ohm × cm.

EXAMPLES 3-6 (for comparison)

Using the same starting powders and in each case the same composition of the powder mixtures as in Examples 1 and 2, cylindrical bodies having a diameter of 180 mm and a height of 200 mm were manufactured using the conventional hot die pressing process.

In Examples 5 and 6, an additional 2% by weight of boric oxide was used as a sintering aid with a correspondingly reduced amount of boron nitride.

Evaporation boats having the same dimensions as in Example 1 were cut in different directions from the blocks manufactured by the hot die pressing process and the density and specific resistance were determined. Considerable scatter in density and, especially, in resistance, were found. In each case, the evaporator having the highest density was used for the further tests.

TESTS ON THE EVAPORATION BOATS

The evaporation boats manufactured in accordance with Examples 1 and 6 were tested under the following conditions for the vacuum evaporation of aluminum.

The boats were heated by the direct passage of current in a vacuum chamber. The aluminum was supplied continuously by way of an aluminum wire. The rate of evaporation was 5 g Al/min. After 60 minutes' evaporation time in each case, the unit was switched off and started up again after cooling.

The durability is determined by the number of cycles in hours after which the evaporators could no longer be used as a result of tears, cracks, bending or corrosion.

The results of this test and the composition and properties of the tested evaporators are shown in the following table.

TABLE

| Example No. | Composition in % by weight | | | | Process | % TD* | specific resistance at room temperature in $\mu ohm \times cm$ | drop in resistance in % after 5 hours' use | Life in hours |
|---|---|---|---|---|---|---|---|---|---|
|  | $TiB_2$ | BN | AlN | $B_2O_3$ | | | | | |
| 1 | 57 | 43 | — | — | HIP** | 97.3 ± 0.2 | 573 ± 10 | 5 | >20 |
| 2 | 53 | 30 | 17 | — | HIP | 98.3 ± 0.2 | 515 ± 9 | 4 | >20 |
| 3 | 57 | 43 | — | — | HP*** | 90.7 ± 1.4 | 668 ± 39 | 15 | 8 |
| 4 | 53 | 30 | 17 | — | HP | 89.2 ± 0.9 | 632 ± 51 | 19 | 6 |
| 5 | 57 | 41 | — | 2 | HP | 96.3 ± 0.4 | 604 ± 28 | 12 | 3 |

TABLE-continued

| Example No. | Composition in % by weight | | | | Process | % TD* | specific resistance at room temperature in μohm × cm | drop in resistance in % after 5 hours' use | Life in hours |
| --- | --- | --- | --- | --- | --- | --- | --- | --- | --- |
| | TiB$_2$ | BN | AlN | B$_2$O$_3$ | | | | | |
| 6 | 53 | 28 | 17 | 2 | HP | 95.9 ± 0.6 | 590 ± 33 | 12 | 5 |

*% TD = % density based on the theoretical density of the mixture
**HIP = hot-isostatic pressing (according to the invention)
***HP = hot pressing (for comparison)

The term "drop in resistance" is to be understood to denote the percentage drop in the resistance of the evaporation boats after 5 hours use. Five hours was selected because one of the evaporators used for comparison failed after only 6 hours. The drop in resistance is generally highest at the start of the heat test because of wetting of the surface of the evaporator by the molten aluminum.

As can be seen from the data in the table, Evaporators Nos. 1 and 2, manufactured according to the invention, had a life of more than 20 hours under the conditions indicated that is, they were usable after a total of 20 cycles. In contrast, Evaporators Nos. 3 and 4, having the same composition, were serviceable for less than 10 hours.

Comparison Evaporators Nos. 5 and 6 which were manufactured by hot pressing with the use of boric oxide as a sintering aid, had a density greater than 95% TD, and had a longer life, but the life was not as high as 20 hours which life was exceeded by evaporators made from articles of the present invention.

The drop in resistance of greater than 10% in the case of all the comparison evaporators indicates moreover, that the molten aluminum did not merely wet the surface of the evaporator, but was able to penetrate the evaporator itself, as the evaporator had pores of non-uniform size.

What is claimed is:

1. A refractory, electrically conductive, article comprising mixed materials, having a density of at least about 95% of the theoretical density and having non-direction-dependent properties, manufactured from powder mixtures that are substantially free of oxygen and metal impurities comprising:
   from about 10 to 60% by weight of hexagonal boron nitride,
   from about 0 to 60% by weight of at least one composition selected from aluminum nitride and silicon nitride, and
   from about 30 to 70% by weight of at least one electrically conductive material selected from the group consisting of titanium boride, zirconium boride, aluminum boride, chromium boride, silicon carbide, titanium carbide and chromium carbide,
by isostatic hot pressing in a vacuum-tight casing, at a temperature of from about 1400° to 1700° C., under a pressure of from about 100 to 300 MPa, using an inert gas as a pressure-transfer medium.

2. An article of claim 1, manufactured from boron nitride powder comprising at least about 98.0% by weight of boron+nitrogen up to about 1.7% by weight of oxygen in the form of adherent boric oxide and boron oxynitrides, up to about 0.1% by weight of carbon and a total of up to about 0.2% by weight of metal impurities, said powder having specific surface area in the range of from about 2 to 30 m$^2$/g, measured according to the BET method.

3. An article of claim 1, manufactured from titanium boride powder as the electrically conductive material and, containing from about 0 to 60% by weight of at least one composition selected from aluminum nitride and silicon nitride powder wherein said powders each have a particle size of less than about 50 μm.

4. An article of claim 1, manufactured from zirconium boride powder as the electrically conductive material and, containing from about 0 to 60% by weight of at least one composition selected from aluminum nitride and silicon nitride powder wherein said powders each have a particle size of less than about 50 μm.

5. A process for the manufacture of the mixed materials according to claim 1 by isostatic hot pressing in a high-pressure autoclave using an inert gas as pressure-transfer medium, comprising:
   forming a homogeneous mixture of the powders forming the composition;
   forming pre-densified green bodies having a density of at least about 50% of the theoretical density from the powder mixture;
   encasing the green bodies under vacuum in a vacuum-tight casing;
   heating the encased bodies in a high-pressure zone at a temperature of about 1400° to 1700° C. while slowly increasing the pressure to from about 100 to 300 MPa for a length of time sufficient to form shaped articles having a density of at least about 95% TD; and cooling and recovering the articles 6. A process for the manufacture of the mixed materials according to claim 2 by isostatic hot pressing in a high-pressure autoclave using an inert gas as pressure-transfer medium, comprising:
   forming a homogeneous mixture of the powders forming the composition;
   forming pre-densified green bodies having a density of at least about 50% of the theoretical density from the powder mixture;
   encasing the green bodies under vacuum in a vacuum-tight casing;
   heating the encased bodies in a high-pressure zone at a temperature of about 1400° to 1700° C. while slowly increasing the pressure to from about 100 to 300 MPa for a length of time sufficient to form shaped articles having a density of at least about 95% TD; and cooling and recovering the articles.

7. A process for the manufacture of the mixed materials according to claim 3 by isostatic hot pressing in a high-pressure autoclave using an inert gas as a pressure-transfer medium, comprising:
   forming a homogeneous mixture of the powders forming the composition;
   forming pre-densified green bodies having a density of at least about 50% of the theoretical density from the powder mixture;
   encasing the green bodies under vacuum in a vacuum-tight casing;
   heating the encased bodies in a high-pressure zone at a temperature of about 1400° to 1700° C. while slowly increasing the pressure to from about 100 to 300 MPa for a length of time sufficient to form shaped articles having a density of at least about 95% TD; and cooling and recovering the articles.

8. A process for the manufacture of the mixed materials according to claim 4 by isostatic hot pressing in a high-pressure autoclave using an inert gas as pressure-transfer medium, comprising:

forming a homogeneous mixture of the powders forming the composition;

forming pre-densified green bodies having a density of at least about 50% of the theoretical density from the powder mixture;

encasing the green bodies under vacuum in a vacuum-tight casing;

heating the encased bodies in a high-pressure zone at a temperature of about 1400° to 1700° C. while slowly increasing the pressure to from about 100 to 300 MPa for a length of time sufficient to form shaped articles having a density of at least about 95% TD; and cooling and recovering the articles.

9. An evaporation boat formed from the article of claim 1.

10. An evaporation boat formed from the article of claim 2.

* * * * *